United States Patent
Hojo et al.

(10) Patent No.: US 7,872,459 B2
(45) Date of Patent: Jan. 18, 2011

(54) SEMICONDUCTOR INTEGRATED CIRCUIT DEVICE AND REGULATOR USING IT

(75) Inventors: Yoshiyuki Hojo, Kyoto (JP); Hirotaka Nakabayashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 313 days.

(21) Appl. No.: 11/913,805

(22) PCT Filed: Mar. 14, 2006

(86) PCT No.: PCT/JP2006/304984

§ 371 (c)(1),
(2), (4) Date: Nov. 7, 2007

(87) PCT Pub. No.: WO2006/137197

PCT Pub. Date: Dec. 28, 2006

(65) Prior Publication Data

US 2009/0091306 A1    Apr. 9, 2009

(30) Foreign Application Priority Data

Jun. 23, 2005    (JP)    ............................ 2005-182839

(51) Int. Cl.
*G05F 1/00*    (2006.01)
(52) U.S. Cl. .................................... 323/273
(58) Field of Classification Search ......... 323/270–273, 323/282; 257/208, 337, 557
See application file for complete search history.

(56) References Cited

U.S. PATENT DOCUMENTS

| 5,017,996 | A  | * | 5/1991 | Yasuoka | 257/370 |
| 5,635,822 | A  | * | 6/1997 | Marchio et al. | 323/273 |
| 6,204,646 | B1 | * | 3/2001 | Hiramatsu et al. | 323/273 |
| 6,448,628 | B2 | * | 9/2002 | Chern et al. | 257/532 |
| 7,019,362 | B2 | * | 3/2006 | Sakamoto et al. | 257/341 |
| 7,173,315 | B2 | * | 2/2007 | Shirokoshi | 257/500 |
| 7,177,123 | B2 | * | 2/2007 | Ito et al. | 361/18 |
| 2002/0163018 | A1 | * | 11/2002 | Kamiya | 257/208 |

FOREIGN PATENT DOCUMENTS

| JP | 63-081970 | 4/1988 |
| JP | 04-123466 | 4/1992 |
| JP | 08-051190 | 2/1996 |
| JP | 09-266226 | 10/1997 |
| JP | 2001-007140 | 1/2001 |

* cited by examiner

*Primary Examiner*—Adolf Berhane
*Assistant Examiner*—Yemane Mehari
(74) *Attorney, Agent, or Firm*—Fish & Richardson P.C.

(57) ABSTRACT

A semiconductor integrated circuit device (IC1) comprises a semiconductor chip (CHIP1), a first frame lead (FR1), and a second frame lead (FR2). The semiconductor chip (CHIP1) includes common-base transistors (P1, P2), pads (T11, T12) connected to the respective emitters of the common-base transistors (P1, P2), pads (T21, T22) connected to the respective collectors of the common-base transistors (P1, P2), and a means (DRV, ERR, E1) for generating a base signal. The pads (T11, T12) are connected through the respective bonding wires (W11, W12) to the first frame lead (FR1). The pads (T21, T22) are connected through the respective bonding wires (W21, W22) to the second frame lead (FR2). This structure can easily detect breaking of the bonding wires connected in parallel.

20 Claims, 5 Drawing Sheets (a) WHEN NORMALLY USED (WHEN HIGH CURRENT IS APPLIED)

(b) WHEN DEVICES ARE SEPARATELY USED

SEMICONDUCTOR INTEGRATED CIRCUIT DEVICE AND REGULATOR USING IT

TECHNICAL FIELD

The present invention relates to a semiconductor integrated circuit device provided with a power transistor and a regulator using this semiconductor integrated circuit device.

BACKGROUND ART

Conventionally, a semiconductor integrated circuit device provided with a power transistor (a so-called power IC) sometimes needs to pass a relatively high current through the power transistor depending on its specifications. Thus, as shown in FIG. 5, a conventional semiconductor integrated circuit device adopts a configuration in which one end of the power transistor is connected in parallel to a plurality of pads and these pads are connected to a common frame (an external terminal) by wire bonding, in other words, a configuration in which a current is divided among a plurality of bonding wires.

As a conventional technology related to what has been described thus far, a semiconductor device for high current in which a large number of unit cells are arranged in parallel is disclosed and proposed (see, for example, Patent Publication 1). The semiconductor device disclosed therein has a chip configuration in which at least one of main electrode regions of this semiconductor device is divided into at least two and more independent bonding pad regions, and mutually independent bonding wires are connected individually to the bonding pads at one end thereof and connected to a common external terminal at the other end thereof.

Patent Publication 1 JP-A-H9-266226

DISCLOSURE OF THE INVENTION

Problems to be Solved by the Invention

With the conventional semiconductor integrated circuit device shown in FIG. 5, it is indeed possible to reduce resistance in the bonding wire that electrically connects between the pad and the frame, making it possible to increase the allowable current of the device.

However, the problem here is that the conventional semiconductor integrated circuit device described above makes it difficult to detect a break in the bonding wires connected in parallel.

The above-described problem will be specifically explained, taking up as an example a case shown in FIG. 5. Assume that a resistance value of one wire is 0.10Ω. Then, if no wire is broken, a combined resistance value of the wires connected in parallel between the chip and the frame is 0.05Ω, and, if one of the wires is broken, a combined resistance value is 0.10Ω. That is, the difference in resistance value due to the presence or absence of a break in the wire is as low as 0.05Ω, which has to be detected with great accuracy for detecting a break in the wire. However, there is a manufacturing error of ±30% in an on-resistance value of the power transistor (for example, a manufacturing error of ±0.15Ω for an on-resistance design value of 0.5Ω), and the difference in resistance value due to the presence or absence of a break in the wire is included in this error range. This makes it very difficult to detect a break.

In view of the conventionally encountered problems discussed above, an object of the present invention is to provide a semiconductor integrated circuit device and a regulator using it that can easily detect a break in bonding wires connected in parallel.

Means for Solving the Problem

To achieve the above object, according to the present invention, a semiconductor integrated circuit device is built with: a semiconductor chip including n power transistors whose opening/closing is controlled by the same control signal, n first pads each connected to one of the n power transistors at one end thereof, n second pads each connected to one of the n power transistors at another end thereof, and control signal generating means for generating the control signal; a first frame to which the first pads are connected via corresponding bonding wires; and a second frame to which the second pads are connected via corresponding bonding wires (first configuration).

Preferably, in the semiconductor integrated circuit device having the first configuration, the power transistors are each a bipolar transistor (second configuration).

Preferably, in the semiconductor integrated circuit device having the second configuration, the power transistors are each a PNP bipolar transistor built with a lightly doped n-type well region formed on a lightly doped p-type substrate, a heavily doped n-type buried region buried under the lightly doped n-type well region, a heavily doped n-type sinker region formed from the top to the bottom of the lightly doped n-type well region so as to make contact with the heavily doped n-type buried region, an extra heavily doped n-type base region formed in the heavily doped n-type sinker region and connected to the output terminal of the control signal generating means as the base of the power transistor, a heavily doped p-type emitter region formed in the lightly doped n-type well region and connected to the first pad as the emitter of the power transistor, and first and second heavily doped p-type collector regions formed in the lightly doped n-type well region in such a way as to sandwich the heavily doped p-type emitter region and connected to the second pad as the collector of the power transistor (third configuration).

Preferably, in the semiconductor integrated circuit device having the second configuration, the power transistors are each an NPN bipolar transistor built with a lightly doped n-type well region formed on a lightly doped p-type substrate, a heavily doped n-type buried region buried under the lightly doped n-type well region, a heavily doped n-type sinker region formed from the top to the bottom of the lightly doped n-type well region so as to make contact with the heavily doped n-type buried region, an extra heavily doped n-type collector region formed in the heavily doped n-type sinker region and connected to the first pad as the collector of the power transistor, a lightly doped p-type well region formed in the lightly doped n-type well region, a heavily doped p-type base region formed in the lightly doped p-type well region and connected to the output terminal of the control signal generating means as the base of the power transistor, and a heavily doped n-type emitter region formed in the lightly doped p-type well region and connected to the second pad as an emitter of the power transistor (fourth configuration).

Alternatively, in the semiconductor integrated circuit device having the first configuration, the power transistors are preferably each a field-effect transistor (fifth configuration).

Preferably, in the semiconductor integrated circuit device having the fifth configuration, the power transistors are each a p-channel field-effect transistor built with a first lightly doped n-type well region formed on a lightly doped p-type substrate, a heavily doped n-type buried region buried under the first lightly doped n-type well region, a second lightly doped n-type well region formed in the first lightly doped n-type well region, a heavily doped p-type source region formed in the second lightly doped n-type well region and connected to the first pad as the source of the power transistor, a heavily doped p-type drain region formed in the second lightly doped n-type well region and connected to the second pad as the drain of the power transistor, a gate region formed so as to straddle the border between the heavily doped p-type source region and the heavily doped p-type drain region and connected to the output terminal of the control signal generating means as the gate of the power transistor, and a heavily doped n-type backgate region formed in the second lightly doped n-type well region and connected to the first pad as the backgate of the power transistor (sixth configuration).

Preferably, in the semiconductor integrated circuit device having the fifth configuration, the power transistors are each an n-channel field-effect transistor built with a heavily doped n-type drain region formed in a lightly doped p-type substrate and connected to the first pad as the drain of the power transistor, a heavily doped n-type source region formed in the lightly doped p-type substrate and connected to the second pad as the source of the power transistor, a gate region formed so as to straddle the border between the heavily doped n-type drain region and the heavily doped n-type source region and connected to the output terminal of the control signal generating means as the gate of the power transistor, and a heavily doped p-type backgate region formed in the lightly doped p-type substrate and connected to the second pad as the backgate of the power transistor (seventh configuration).

According to the present invention, a regulator is provided with: the semiconductor integrated circuit device having one of the first to seventh configurations; an input smoothing capacitor connected between the first frame to which an input voltage is applied and an earth terminal; an output smoothing capacitor connected between the second frame from which an output voltage is derived and an earth terminal; and a feedback voltage generating means for generating a feedback voltage according to the output voltage. The control signal generating means generates the control signal so that the feedback voltage is made equal to a predetermined reference voltage (eighth configuration).

ADVANTAGES OF THE INVENTION

As described above, with the semiconductor integrated circuit device of the present invention and the regulator using this semiconductor integrated circuit device, it is possible to easily detect a break in the bonding wires connected in parallel.

LIST OF REFERENCE SYMBOLS

IC1 semiconductor integrated circuit device
CHIP1 semiconductor chip
P1 first power transistor
P2 second power transistor
DRV driver circuit
T11, T12 first pads (one for each of the emitters of P1, P2)
T21, T22 second pads (one for each of the collectors of P1, P2)
T3 third pad
W11, W12 first bonding wires (one for each of the emitters of P1, P2)
W21, W22 second bonding wires (one for each of the collectors of P1, P2)
W3 third bonding wire
FR1 first frame (shared by the emitters of P1, P2)
FR2 second frame (shared by the collectors of P1, P2)
FR3 third frame
ERR error amplifier
E1 direct current voltage source
C1 smoothing capacitor (on the input side)
C2 smoothing capacitor (on the output side)
R1, R2 resistances (feedback voltage generating portion)
1 lightly doped p-type substrate [p−]
2a, 2b heavily doped n-type buried regions [n+]
3 lightly doped n-type well region [n-]
4 isolation region [p+]
5a, 5b heavily doped n-type sinker regions [n+]
6a, 6b base regions [n++]
7a, 7b emitter regions [p+]
8a, 8b first collector regions [p+]
9a, 9b second collector regions [p+]

BEST MODE FOR CARRYING OUT THE INVENTION

Figure 1:
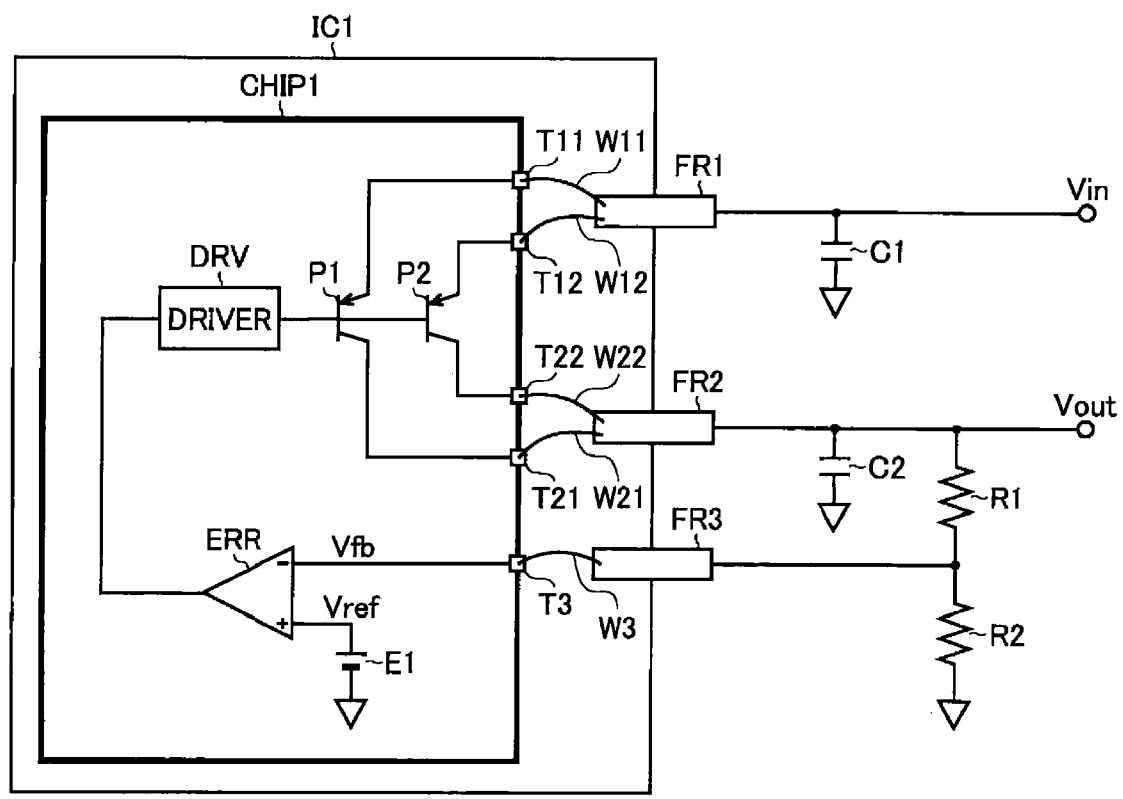
FIG. 1 A circuit diagram showing one embodiment of the series regulator using the semiconductor integrated circuit device of the present invention.

FIG. 1 is a circuit diagram showing one embodiment of the series regulator using the semiconductor integrated circuit device of the present invention.

As shown in this figure, the series regulator of this embodiment is built with a semiconductor integrated circuit device IC1, smoothing capacitors C1 and C2, and resistances R1 and R2. The semiconductor integrated circuit device IC1 is formed by mounting a semiconductor chip CHIP1 and first to third frames (external terminals) FR1 to FR3 in a single package.

Outside the semiconductor integrated circuit device IC1, the first frame FR1 to which an input voltage Vin is applied is grounded via the smoothing capacitor C1, and the second frame FR2 from which an output voltage Vout is derived is grounded via the smoothing capacitor C2 and also via a circuit (a feedback voltage generating circuit generating a feedback voltage Vfb according to the output voltage Vout) in which the resistances R1 and R2 are connected in series. The feedback voltage Vfb is outputted from a node at which the resistances R1 and R2 are connected together, and this node is connected to a frame T3 of the semiconductor integrated circuit device IC1.

On the other hand, the semiconductor chip CHIP1 has PNP bipolar transistors P1 and P2, first pads T11 and T12, second pads T21 and T22, a third pad T3, a driver circuit DRV, an error amplifier ERR, and a direct current voltage source E1 integrated thereon.

The emitters of the transistors P1 and P2 are connected to the first pads T11 and T12 respectively. The first pads T11 and T12 are connected to the first frame FR1 via bonding wires W11 and W12 respectively. The collectors of the transistors P1 and P2 are connected to the second pads T21 and T22 respectively. The second pads T21 and T22 are connected to the second frame FR2 via bonding wires W21 and W22 respectively. The bases of the transistors P1 and P2 are both connected to the control signal output terminal of the driver circuit DRV. The inverting input terminal (−) of the error amplifier ERR is connected to the third pad T3. The third pad T3 is connected to the third frame FR3 via a bonding wire W3. The error amplifier ERR is connected at the non-inverting input terminal (+) thereof to the positive terminal of a direct current voltage source E1 (for example, a band gap power supply circuit), and receives at the non-inverting input terminal (+) thereof a reference voltage Vref applied thereto for setting a target value of the output voltage Vout. The negative terminal of the direct current voltage source E1 is grounded. The output terminal of the error amplifier ERR is connected to the error voltage signal input terminal of the driver circuit DRV.

In addition to the circuit components described above, the semiconductor chip CHIP1 has also various built-in protection circuits (for example, an overcurrent protection circuit for preventing the IC from breaking down owing to output short-circuit or the like, an overvoltage protection circuit for preventing the power supply from breaking down owing to power surge, or an overheating protection circuit for preventing thermal destruction resulting from an overload or the like). These protection circuits are not directly related to the present invention, and therefore they are not shown in the accompanying figures and their detailed explanations will be omitted.

A basic operation of the series regulator configured as described above will be explained. In the semiconductor chip CHIP1, the error amplifier ERR amplifies the difference between the feedback voltage Vfb and the reference voltage Vref, and then outputs the resultant voltage to the driver circuit DRV. The driver circuit DRV controls the opening/closing of the transistors P1 and P2 so as to make an error voltage signal low. More specifically, when the feedback voltage Vfb is lower than the reference voltage Vref, the driver circuit DRV generates a control signal for controlling the transistors P1 and P2 so as to make the output voltage Vout high. On the other hand, when the feedback voltage Vfb is higher than the reference voltage Vref, the driver circuit DRV generates a control signal for controlling the transistors P1 and P2 so as to make the output voltage Vout low. The operation described above makes it possible to generate a desired output voltage Vout from the input voltage Vin.

Here, as shown in FIG. 1, the semiconductor integrated circuit device IC1 of this embodiment adopts a configuration in which the transistors P1 and P2 are provided in parallel, and the first frame FR1 and the second frame FR2 are connected to each other via two independent current paths (a first path running from the wire W11 to the wire W21 through the first pad T11, the transistor P1, and the second pad T21, and a second path running from the wire W12 to the wire W22 through the first pad T12, the transistor P2, and the second pad T22), that is, a configuration in which a current is divided between the above-described first and second paths.

Figure 3:
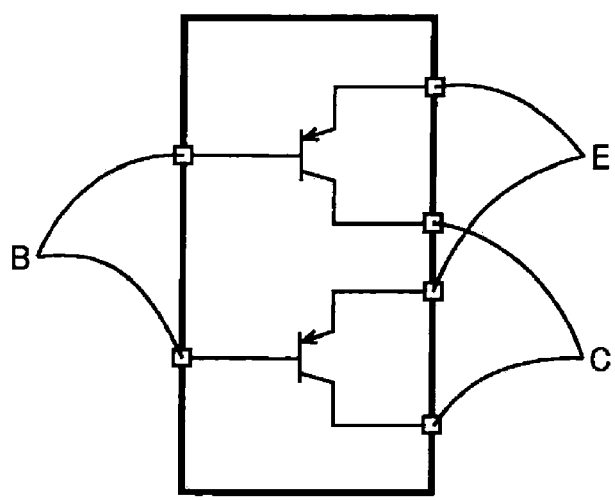
FIG. 3 An illustration for explaining how the power transistor device is used differently.
Figure 3:
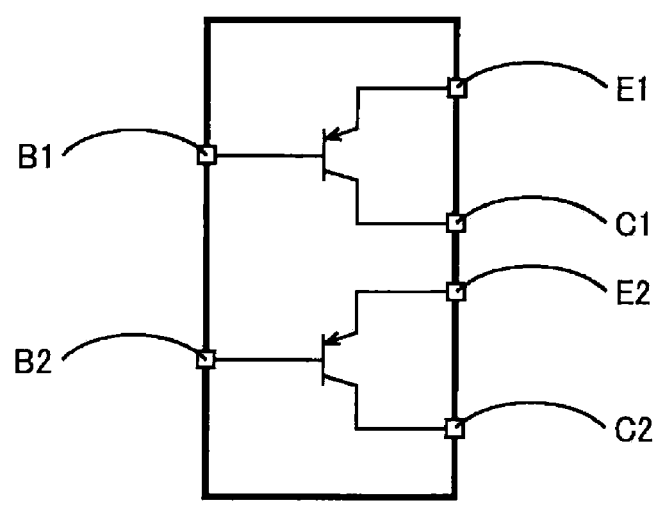

With this configuration, as is the case of the conventional configuration shown in FIG. 3, it is possible to reduce resistance in the bonding wire that electrically connects between the pad and the frame, making it possible to increase the allowable current of the device. It is to be noted that this configuration can be achieved without increasing chip size, because the transistors P1 and P2 are half of the size (have twice the on-resistance) of a power transistor that was supposed to be provided.

Additionally, assume that a resistance of one wire is Ra=0.10Ω, and an on-resistance of each of the transistors P1 and P2 is Rb=1.0±0.3Ω. Then, if no wire is broken, a combined resistance value of the first and second frames is between 0.45 and 0.75 (=(Ra×2+Rb)/2)Ω, and, if one of the wires is broken, a combined resistance value is between 0.9 and 1.5 (=Ra×2+Rb)Ω. That is, the path resistance value obtained when a wire is broken is double the value obtained when no wire is broken. Thus, by adopting the configuration of this embodiment, it becomes possible not only to increase the allowable current of the device, but also to easily detect a break in one of the bonding wires connected in parallel, even if it is on either the emitter side or the collector side.

Figure 2:
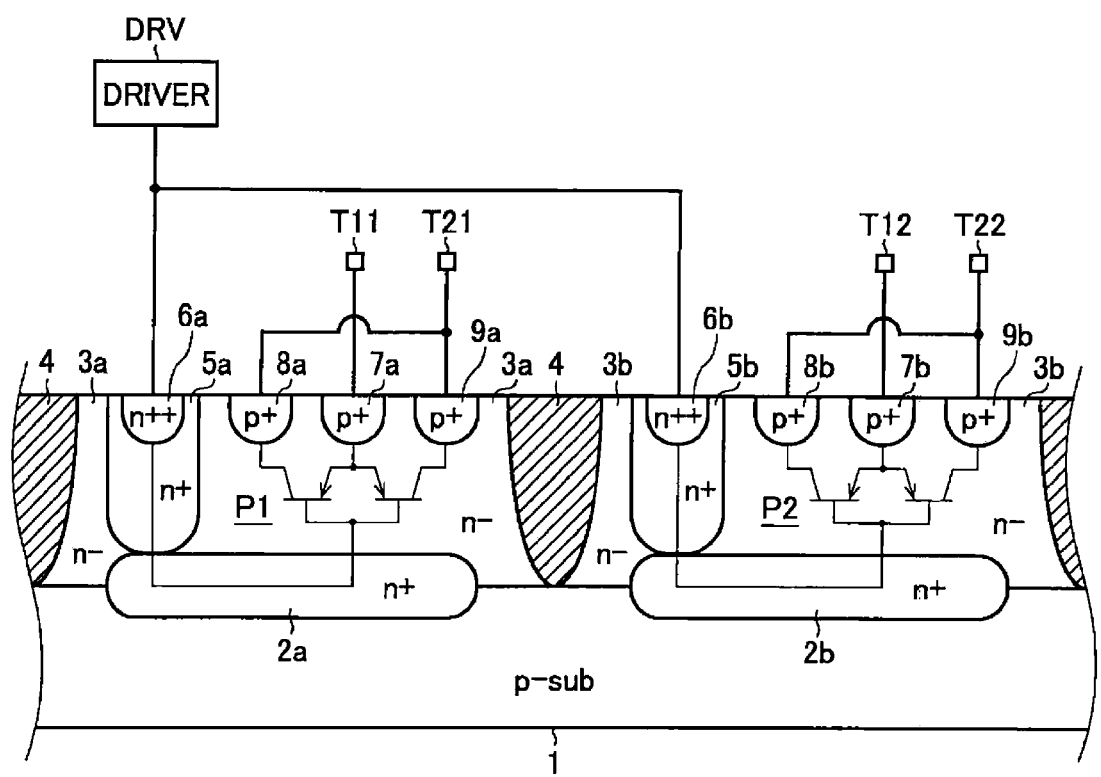
FIG. 2 A longitudinal sectional view of the semiconductor chip CHIP1.

Next, the configuration of the semiconductor chip 1 (especially near the transistors P1 and P2) will be described in detail with reference to FIG. 2. FIG. 2 is a longitudinal sectional view of the semiconductor chip CHIP1.

As shown in this figure, in the semiconductor chip 1 of this embodiment, the transistors P1 and P2 are built with: lightly doped n-type [n−] well regions 3a and 3b; an isolation region (heavily doped p-type [p+] region) 4; heavily doped n-type [n+] buried regions 2a and 2b; heavily doped n-type [n+] sinker regions 5a and 5b; extra heavily doped n-type [n++] base regions 6a and 6b; heavily doped p-type [p+] emitter regions 7a and 7b; and first heavily doped p-type [p+] collector regions 8a and 8a and second heavily doped p-type [p+] collector regions 9a and 9b. The lightly doped n-type [n−] well regions 3a and 3b are formed on a lightly doped p-type [p−] substrate 1. The isolation region 4 isolates the transistors P1 and P2 from each other. The heavily doped n-type [n+] buried regions 2a and 2b are buried under the lightly doped n-type [n−] well regions 3a and 3b respectively. The heavily doped n-type [n+] sinker regions 5a and 5b are formed from the top to the bottom of the lightly doped n-type [n−] well regions 3a and 3b so as to make contact with the heavily doped n-type [n+] buried regions 2a and 2b respectively. The extra heavily doped n-type [n++] base regions 6a and 6b are formed in the heavily doped n-type [n+] sinker regions 5a and 5b respectively and connected to the output terminal of the driver circuit DRV, thereby serving as the bases of the transistors P1 and P2 respectively. The heavily doped p-type [p+] emitter regions 7a and 7b are formed in the lightly doped n-type [n−] well regions 3a and 3b respectively and connected to the first pads T11 and T12, thereby serving as the emitters of the transistors P1 and P2 respectively. The first heavily doped p-type [p+] collector region 8a and the second heavily doped p-type [p+] collector region 9a are formed in the lightly doped n-type [n−] well region 3a in such a way as to sandwich the heavily doped p-type [p+] emitter region 7a and connected to the second pad T21, thereby serving as the collector of the transistor P1. The first heavily doped p-type [p+] collector region 8b and the second heavily doped p-type [p+] collector region 9b are formed in the lightly doped n-type [n−] well region 3b in such a way as to sandwich the heavily doped p-type [p+] emitter region 7b and connected to the second pad T22, thereby serving as the collector of the transistor P2.

The semiconductor chip 1 configured as described above is formed through the following first to sixth processes.

First, in the first process, n-type impurities are diffused into the lightly doped p-type [p−] substrate 1 to form the heavily doped n-type [n+] buried regions 2a and 2b. These heavily doped n-type [n+] buried regions 2a and 2b are formed to reduce the resistance accompanied by the leading out of the base.

In the second process, a lightly doped n-type [n−] single crystal silicon layer is epitaxially grown on the lightly doped p-type [p−] substrate 1 in vapor phase.

In the third process, heavily doped p-type [p+] impurities are diffused (isolation diffusion) to form the isolation region 4 for isolating the transistors P1 and P2 from each other. As a result of this process, the above-described epitaxially grown layer is separated into the lightly doped n-type [n−] well regions 3a and 3b.

In the fourth process, n-type impurities are diffused into the lightly doped n-type [n−] well regions 3a and 3b from the top to the bottom thereof so as to make contact with the heavily doped n-type [n+] buried regions 2a and 2b. In this way, the heavily doped n-type [n+] sinker regions 5a and 5b are formed. These heavily doped n-type [n+] sinker regions 5a and 5b are formed to reduce the resistance accompanied by the leading out of the base.

In the fifth process, n-type impurities are further diffused into the heavily doped n-type [n+] sinker regions 5a and 5b, whereby the extra heavily doped n-type [n++] base regions 6a and 6b (corresponding to the bases of transistors P1 and P2) are formed.

In the sixth process, p-type impurities are diffused into the lightly doped n-type [n−] well regions 3a and 3b, whereby the heavily doped p-type [p+] emitter regions 7a and 7b (corresponding to the emitters of the transistors P1 and P2) are formed. Also in this process, the first heavily doped p-type [p+] collector region 8a and the second heavily doped p-type [p+] collector region 9a (corresponding to the collector of the transistor P1) are formed in such a way as to sandwich the heavily doped p-type [p+] emitter region 7a, and the first heavily doped p-type [p+] collector region 8b and the second heavily doped p-type [p+] collector region 9b (corresponding to the collector of the transistor P2) are formed in such a way as to sandwich the heavily doped p-type [p+] emitter region 7b.

In the following processes, a silicon insulating film, a contact hole, an aluminum conductor, and a protect film are sequentially formed.

The above-described configuration of the transistors P1 and P2 makes it possible to completely isolate them from each other. Here, good characteristics evenness between two transistors can be obtained without greatly increasing layout area. Additionally, since the devices are completely isolated from each other, the single power transistor can be used either as one device or as two devices (see FIG. 3).

The embodiment described above deals with a series regulator using the semiconductor integrated circuit device of the present invention. However, the present invention is not limited to this specific configuration and application. It should be understood that the present invention finds wide application in semiconductor integrated circuit devices in general that deal with a high current (for example, an amplifier, a comparator, or a single power transistor).

It is to be understood that the present invention may be practiced in any other manner than specifically described above as embodiments, and various modifications are possible within the scope of the invention. For example, it is possible to use three and more power transistors connected in parallel, or use as a power transistor an NPN bipolar transistor (see FIG. 4 (a)) or a p-channel or n-channel field-effect transistor (see FIG. 4 (b) or 4(c)).

Figure 4:
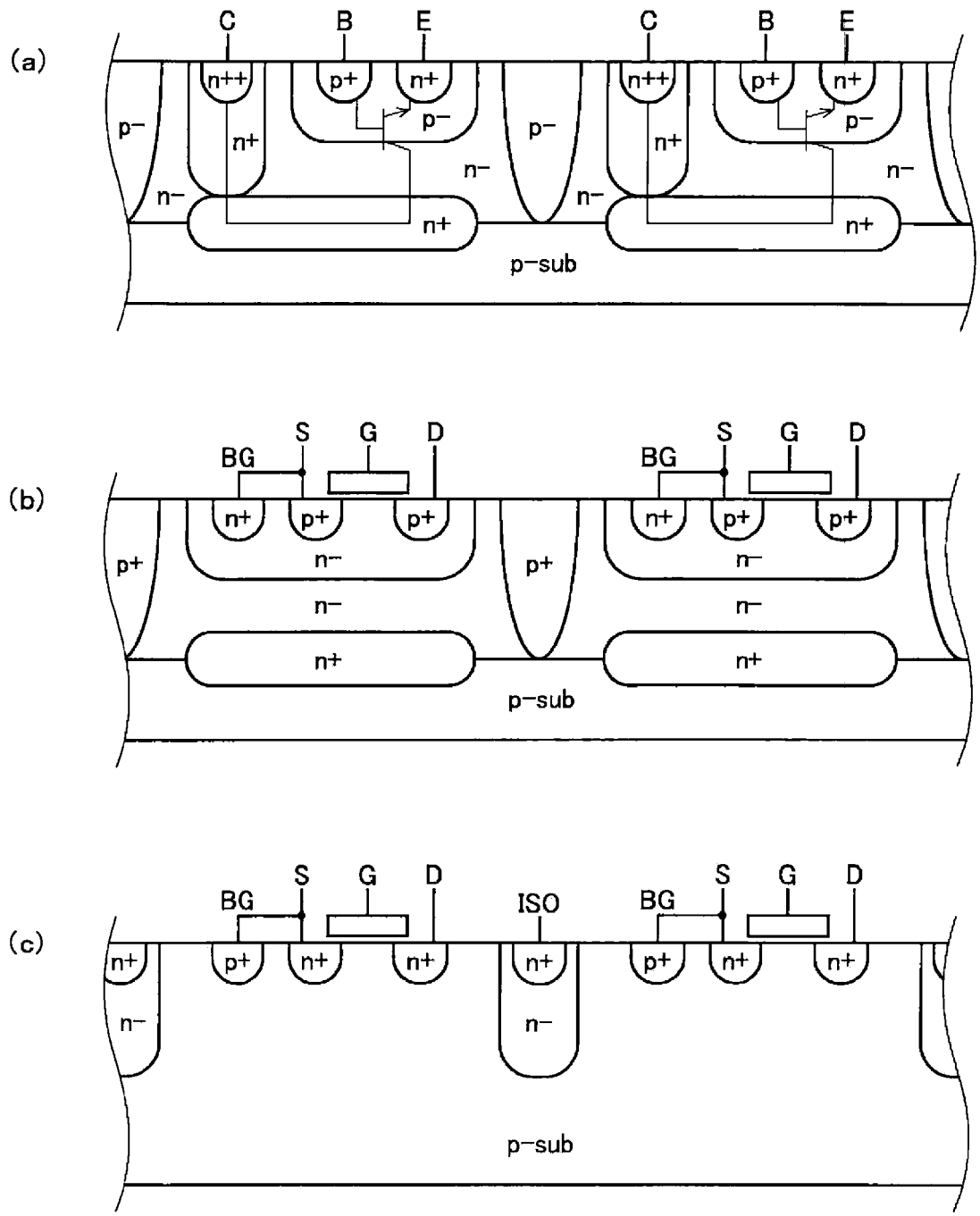
FIG. 4 A longitudinal sectional view showing another example of the semiconductor chip CHIP1.
Figure 5:
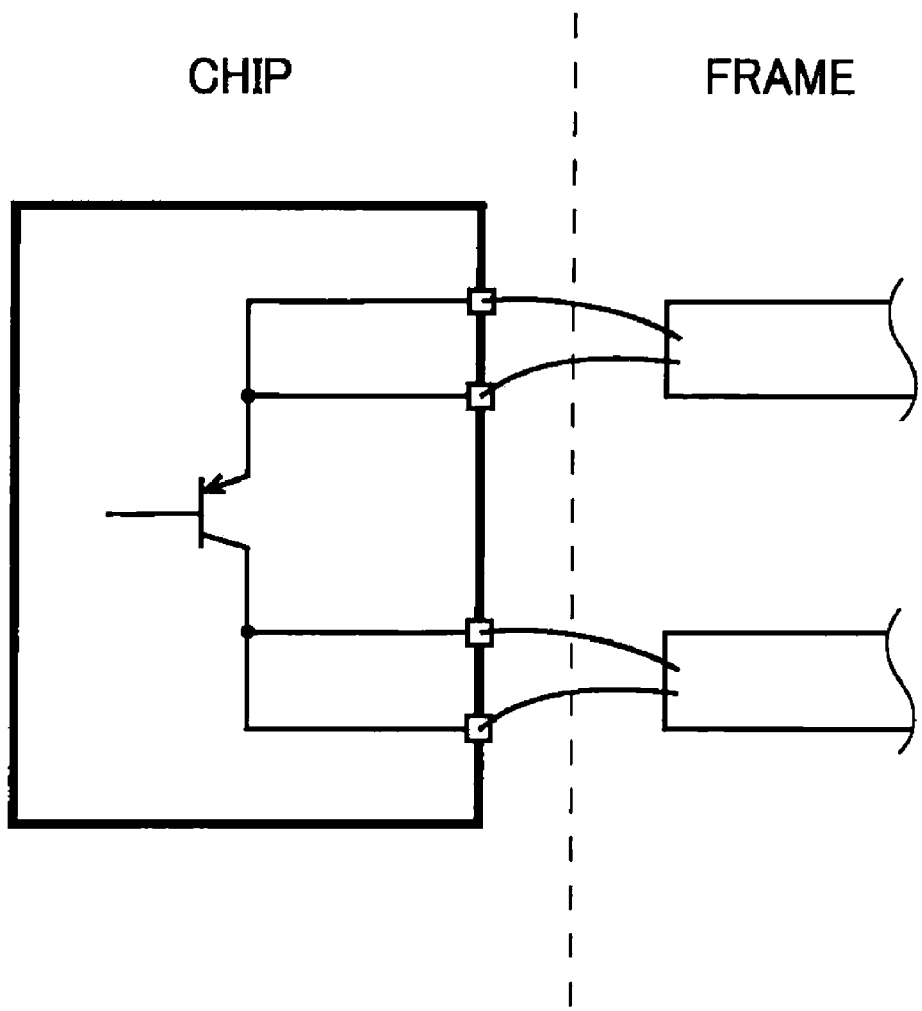
FIG. 5 A schematic diagram showing the configuration of a conventional example of a semiconductor integrated circuit device.

More specifically, as shown in FIG. 4 (a), the power transistor may be an NPN bipolar transistor built with: a lightly doped n-type well region; a heavily doped n-type buried region; a heavily doped n-type sinker region; an extra heavily doped n-type collector region; a lightly doped p-type well region; a heavily doped p-type base region; and a heavily doped n-type emitter region. The lightly doped n-type well region is formed on a lightly doped p-type substrate. The heavily doped n-type buried region is buried under the lightly doped n-type well region. The heavily doped n-type sinker region is formed in the lightly doped n-type well region from the top to the bottom so as to make contact with the heavily doped n-type buried region. The extra heavily doped n-type collector region is formed in the highly doped n-type sinker region and connected to the first pad, thereby serving as the collector of the power transistor. The lightly doped p-type well region is formed in the lightly doped n-type well region. The heavily doped p-type base region is connected to the output terminal of the driver circuit, thereby serving as the base of the power transistor. The heavily doped n-type emitter region is formed in the lightly doped p-type well region and connected to the second pad, thereby serving as the emitter of the power transistor. Here, the devices may be isolated from each other by a lightly doped p-type isolation region.

Alternatively, as shown in FIG. 4 (b), the power transistor may be a p-channel field-effect transistor built with: a first lightly doped n-type well region; a heavily doped n-type buried region; a second lightly doped n-type well region; a heavily doped p-type source region; a heavily doped p-type drain region; a gate region; and a heavily doped n-type backgate region. The first lightly doped n-type well region is formed on a lightly doped p-type substrate. The heavily doped n-type buried region is buried under the first lightly doped n-type well region. The second lightly doped n-type well region is formed in the first lightly doped n-type well region. The heavily doped p-type source region is formed in the second lightly doped n-type well region and connected to the first pad, thereby serving as the source of the power transistor. The heavily doped p-type drain region is formed in the second lightly doped n-type well region and connected to the second pad, thereby serving as the drain of the power transistor. The gate region is formed so as to straddle the border between the heavily doped p-type source region and the heavily doped p-type drain region and connected to the output terminal of the driver circuit, thereby serving as the gate of the power transistor. The heavily doped n-type backgate region is formed in the second lightly doped n-type well region and connected to the first pad, thereby serving as the backgate of the power transistor. Here, the devices may be isolated from each other by a heavily doped p-type isolation region.

Alternatively, as shown in FIG. 4 (c), the power transistor may be an n-channel field-effect transistor built with: a heavily doped n-type drain region; a heavily doped n-type source region; a gate region; and a heavily doped p-type backgate region. The heavily doped n-type drain region is formed in a lightly doped p-type substrate and connected to the first pad, thereby serving as the drain of the power transistor. The heavily doped n-type source region is formed in the lightly doped p-type substrate and connected to the second pad, thereby serving as the source of the power transistor. The gate region is formed so as to straddle the border between the heavily doped n-type drain region and the heavily doped n-type source region and connected to the output terminal of the driver circuit, thereby serving as the gate of the power transistor. The heavily doped p-type backgate region is formed in the lightly doped p-type substrate and connected to the second pad, thereby serving as the backgate of the power transistor. Here, the devices may be isolated by a lightly doped n-type isolation region.

INDUSTRIAL APPLICABILITY

The present invention is useful for the improvement of the reliability of a semiconductor integrated circuit device dealing with a high current and a regulator using this semiconductor integrated circuit device.

What is claimed is:

1. A semiconductor integrated circuit device comprising:
a semiconductor chip including:
n power transistors each controlled by a control signal,
n first pads each connected to a respective one of the n power transistors at one end thereof,
n second pads each connected to a respective one of the n power transistors at another end thereof, wherein the semiconductor chip has the same number of first pads as there are power transistors controlled by the control signal and has the same number of second pads as there are power transistors controlled by the control signal; and
a control signal generating circuit arranged to generate the control signal,
wherein each of the power transistors is a PNP bipolar transistor comprising:
a lightly doped n-type well region on a lightly doped p-type substrate,
a heavily doped n-type buried region under the lightly doped n-type well region,
a heavily doped n-type sinker region from a top to a bottom of the lightly doped n-type well region so as to make contact with the heavily doped n-type buried region,
an extra heavily doped n-type base region in the heavily doped n-type sinker region and connected to an output terminal of the control signal generating circuit as a base of the power transistor,
a heavily doped p-type emitter region in the lightly doped n-type well region and connected to the first pad as an emitter of the power transistor, and
first and second heavily doped p-type collector regions in the lightly doped n-type well region so as to sandwich the heavily doped p-type emitter region and connected to the second pad as a collector of the power transistor.

2. The semiconductor integrated circuit device according to claim 1 further comprising:
a first frame connected to the first pads via corresponding bonding wires; and
a second frame connected to the second pads via corresponding bonding wires.

3. A regulator comprising:
the semiconductor integrated circuit device of claim 2;
an input smoothing capacitor connected between the first frame to which an input voltage is applied and an earth terminal;
an output smoothing capacitor connected between the second frame from which an output voltage is derived and an earth terminal; and
a feedback voltage generating means for generating a feedback voltage according to the output voltage;
wherein the control signal generating circuit is arranged to generate the control signal so that the feedback voltage is made equal to a predetermined reference voltage.

4. A semiconductor integrated circuit device comprising:
a semiconductor chip including:
n power transistors each controlled by a control signal,
n first pads each connected to a respective one of the n power transistors at one end thereof,
n second pads each connected to a respective one of the n power transistors at another end thereof, wherein the semiconductor chip has the same number of first pads as there are power transistors controlled by the control signal and has the same number of second pads as there are power transistors controlled by the control signal; and
a control signal generating circuit arranged to generate the control signal,
wherein each of the power transistors is an NPN bipolar transistor comprising:
a lightly doped n-type well region on a lightly doped p-type substrate,
a heavily doped n-type buried region under the lightly doped n-type well region,
a heavily doped n-type sinker region from a top to a bottom of the lightly doped n-type well region so as to make contact with the heavily doped n-type buried region,
an extra heavily doped n-type collector region in the heavily doped n-type sinker region and connected to the first pad as a collector of the power transistor,
a lightly doped p-type well region in the lightly doped n-type well region,
a heavily doped p-type base region in the lightly doped p-type well region and connected to an output terminal of the control signal generating circuit as a base of the power transistor, and
a heavily doped n-type emitter region in the lightly doped p-type well region and connected to the second pad as an emitter of the power transistor.

5. The semiconductor integrated circuit device according to claim 4 further comprising:
a first frame connected to the first pads via corresponding bonding wires; and
a second frame connected to the second pads via corresponding bonding wires.

6. A semiconductor integrated circuit device comprising:
a semiconductor chip including:
n power transistors each controlled by a control signal,
n first pads each connected to a respective one of the n power transistors at one end thereof,
n second pads each connected to a respective one of the n power transistors at another end thereof, wherein the semiconductor chip has the same number of first pads as there are power transistors controlled by the control signal and has the same number of second pads as there are power transistors controlled by the control signal; and
a control signal generating circuit arranged to generate the control signal,
wherein each of the power transistors is a p-channel field-effect transistor comprising:
a first lightly doped n-type well region on a lightly doped p-type substrate,
a heavily doped n-type buried region under the first lightly doped n-type well region,
a second lightly doped n-type well region in the first lightly doped n-type well region,
a heavily doped p-type source region in the second lightly doped n-type well region and connected to the first pad as a source of the power transistor,
a heavily doped p-type drain region in the second lightly doped n-type well region and connected to the second pad as a drain of the power transistor,
a gate region that straddles a border between the heavily doped p-type source region and the heavily doped p-type drain region and connected to an output terminal of the control signal generating circuit as a gate of the power transistor, and a heavily doped n-type backgate region in the second lightly doped n-type well region and connected to the first pad as a backgate of the power transistor.

7. The semiconductor integrated circuit device according to claim 6 further comprising:
a first frame connected to the first pads via corresponding bonding wires; and
a second frame connected to the second pads via corresponding bonding wires.

8. A regulator comprising:
the semiconductor integrated circuit device of claim 7;
an input smoothing capacitor connected between the first frame to which an input voltage is applied and an earth terminal;
an output smoothing capacitor connected between the second frame from which an output voltage is derived and an earth terminal; and
a feedback voltage generating means for generating a feedback voltage according to the output voltage;
wherein the control signal generating circuit is arranged to generate the control signal so that the feedback voltage is made equal to a predetermined reference voltage.

9. A semiconductor integrated circuit device comprising:
a semiconductor chip including:
n power transistors each controlled by a control signal,
n first pads each connected to a respective one of the n power transistors at one end thereof,
n second pads each connected to a respective one of the n power transistors at another end thereof, wherein the semiconductor chip has the same number of first pads as there are power transistors controlled by the control signal and has the same number of second pads as there are power transistors controlled by the control signal; and
a control signal generating circuit arranged to generate the control signal,
wherein each of the power transistors is an n-channel field-effect transistor comprising:
a heavily doped n-type drain region in a lightly doped p-type substrate and connected to the first pad as a drain of the power transistor,
a heavily doped n-type source region in the lightly doped p-type substrate and connected to the second pad as a source of the power transistor,
a gate region that straddles a border between the heavily doped n-type drain region and the heavily doped n-type source region and connected to an output terminal of the control signal generating circuit as a gate of the power transistor, and
a heavily doped p-type backgate region in the lightly doped p-type substrate and connected to the second pad as a backgate of the power transistor.

10. The semiconductor integrated circuit device according to claim 9 further comprising:
a first frame connected to the first pads via corresponding bonding wires; and
a second frame connected to the second pads via corresponding bonding wires.

11. A semiconductor integrated circuit device comprising:
a plurality of power transistors each controlled by a control signal,
a plurality of first pads each connected to a respective one of the plurality of power transistors at one end thereof,
a plurality of second pads each connected to a respective one of the plurality of power transistors at another end thereof, wherein the semiconductor chip has the same number of first pads as there are power transistors controlled by the control signal and has the same number of second pads as there are power transistors controlled by the control signal, and
a control signal generating circuit arranged to generate the control signal,
wherein each of the power transistors is a PNP bipolar transistor comprising:
a lightly doped n-type well region on a lightly doped p-type substrate,
a heavily doped n-type buried region under the lightly doped n-type well region,
a heavily doped n-type sinker region from a top to a bottom of the lightly doped n-type well region so as to make contact with the heavily doped n-type buried region,
an extra heavily doped n-type base region in the heavily doped n-type sinker region and connected to an output terminal of the control signal generating circuit as a base of the power transistor,
a heavily doped p-type emitter region in the lightly doped n-type well region and connected to the first pad as an emitter of the power transistor, and
first and second heavily doped p-type collector regions in the lightly doped n-type well region so as to sandwich the heavily doped p-type emitter region and connected to the second pad as a collector of the power transistor.

12. The semiconductor integrated circuit device according to claim 11, further comprising:
a first frame connected to the first pads via corresponding bonding wires; and
a second frame connected to the second pads via corresponding bonding wires.

13. A regulator comprising:
the semiconductor integrated circuit device of claim 12;
an input smoothing capacitor connected between the first frame to which an input voltage is applied and an earth terminal;
an output smoothing capacitor connected between the second frame from which an output voltage is derived and an earth terminal; and
a feedback voltage generating means for generating a feedback voltage according to the output voltage;
wherein the control signal generating circuit is arranged to generate the control signal so that the feedback voltage is made equal to a predetermined reference voltage.

14. A semiconductor integrated circuit device comprising:
a plurality of power transistors each controlled by a control signal,
a plurality of first pads each connected to a respective one of the plurality of power transistors at one end thereof,
a plurality of second pads each connected to a respective one of the plurality of power transistors at another end thereof, wherein the semiconductor chip has the same number of first pads as there are power transistors controlled by the control signal and has the same number of second pads as there are power transistors controlled by the control signal, and
a control signal generating circuit arranged to generate the control signal,
wherein each of the power transistors is an NPN bipolar transistor comprising:
a lightly doped n-type well region on a lightly doped p-type substrate,
a heavily doped n-type buried region under the lightly doped n-type well region,
a heavily doped n-type sinker region from a top to a bottom of the lightly doped n-type well region so as to make contact with the heavily doped n-type buried region, an extra heavily doped n-type collector region in the heavily doped n-type sinker region and connected to the first pad as a collector of the power transistor, a lightly doped p-type well region in the lightly doped n-type well region, a heavily doped p-type base region in the lightly doped p-type well region and connected to an output terminal of the control signal generating circuit as a base of the power transistor, and a heavily doped n-type emitter region in the lightly doped p-type well region and connected to the second pad as an emitter of the power transistor.

15. The semiconductor integrated circuit device according to claim 14, further comprising:

a first frame connected to the first pads via corresponding bonding wires; and a second frame connected to the second pads via corresponding bonding wires.

16. A semiconductor integrated circuit device comprising:

a plurality of power transistors each controlled by a control signal, a plurality of first pads each connected to a respective one of the plurality of power transistors at one end thereof, a plurality of second pads each connected to a respective one of the plurality of power transistors at another end thereof, wherein the semiconductor chip has the same number of first pads as there are power transistors controlled by the control signal and has the same number of second pads as there are power transistors controlled by the control signal, and a control signal generating circuit arranged to generate the control signal, wherein each of the power transistors is a p-channel field-effect transistor comprising:

a first lightly doped n-type well region on a lightly doped p-type substrate, a heavily doped n-type buried region under the first lightly doped n-type well region, a second lightly doped n-type well region in the first lightly doped n-type well region, a heavily doped p-type source region in the second lightly doped n-type well region and connected to the first pad as a source of the power transistor, a heavily doped p-type drain region in the second lightly doped n-type well region and connected to the second pad as a drain of the power transistor, a gate region that straddles a border between the heavily doped p-type source region and the heavily doped p-type drain region and connected to an output terminal of the control signal generating circuit as a gate of the power transistor, and a heavily doped n-type backgate region in the second lightly doped n-type well region and connected to the first pad as a backgate of the power transistor.

17. The semiconductor integrated circuit device according to claim 16, further comprising:

a first frame connected to the first pads via corresponding bonding wires; and a second frame connected to the second pads via corresponding bonding wires.

18. A regulator comprising:

the semiconductor integrated circuit device of claim 17;

an input smoothing capacitor connected between the first frame to which an input voltage is applied and an earth terminal;

an output smoothing capacitor connected between the second frame from which an output voltage is derived and an earth terminal; and a feedback voltage generating means for generating a feedback voltage according to the output voltage;

wherein the control signal generating circuit is arranged to generate the control signal so that the feedback voltage is made equal to a predetermined reference voltage.

19. A semiconductor integrated circuit device comprising:

a plurality of power transistors each controlled by a control signal, a plurality of first pads each connected to a respective one of the plurality of power transistors at one end thereof, a plurality of second pads each connected to a respective one of the plurality of power transistors at another end thereof, wherein the semiconductor chip has the same number of first pads as there are power transistors controlled by the control signal and has the same number of second pads as there are power transistors controlled by the control signal, and a control signal generating circuit arranged to generate the control signal, wherein each of the power transistors is an n-channel field-effect transistor comprising:

a heavily doped n-type drain region in a lightly doped p-type substrate and connected to the first pad as a drain of the power transistor, a heavily doped n-type source region in the lightly doped p-type substrate and connected to the second pad as a source of the power transistor, a gate region that straddles a border between the heavily doped n-type drain region and the heavily doped n-type source region and connected to an output terminal of the control signal generating circuit as a gate of the power transistor, and a heavily doped p-type backgate region in the lightly doped p-type substrate and connected to the second pad as a backgate of the power transistor.

20. The semiconductor integrated circuit device according to claim 19, further comprising:

a first frame connected to the first pads via corresponding bonding wires; and a second frame connected to the second pads via corresponding bonding wires.

* * * * *